(12) United States Patent
Taniguchi

(10) Patent No.: US 8,456,254 B2
(45) Date of Patent: Jun. 4, 2013

(54) ACOUSTIC WAVE FILTER DEVICE

(75) Inventor: Yasumasa Taniguchi, Ishikawa-ken (JP)

(73) Assignee: Murata Manufacturing Co., Ltd. (JP)

( * ) Notice: Subject to any disclaimer, the term of this patent is extended or adjusted under 35 U.S.C. 154(b) by 630 days.

(21) Appl. No.: 12/483,463

(22) Filed: Jun. 12, 2009

(65) Prior Publication Data

US 2009/0256649 A1   Oct. 15, 2009

Related U.S. Application Data

(63) Continuation of application No. PCT/JP2007/071887, filed on Nov. 12, 2007.

(30) Foreign Application Priority Data

Dec. 14, 2006  (JP) .................................. 2006-337116

(51) Int. Cl.
   *H01L 41/00* (2006.01)
   *H03H 9/02* (2006.01)

(52) U.S. Cl.
   USPC .......................................... 333/133; 333/186

(58) Field of Classification Search
   USPC .................. 333/187, 189, 193, 132–133, 186
   See application file for complete search history.

(56) References Cited

U.S. PATENT DOCUMENTS

| | | | | |
|---|---|---|---|---|
| 5,726,610 A | * | 3/1998 | Allen et al. | 333/133 |
| 6,710,677 B2 | * | 3/2004 | Beaudin et al. | 333/133 |
| 6,909,338 B2 | * | 6/2005 | Omote | 333/133 |
| 7,034,638 B2 | * | 4/2006 | Yamamoto et al. | 333/193 |
| 7,084,718 B2 | * | 8/2006 | Nakamura et al. | 333/133 |
| 7,479,848 B2 | * | 1/2009 | Kuroda | 333/133 |
| 7,535,319 B2 | * | 5/2009 | Park et al. | 333/133 |

FOREIGN PATENT DOCUMENTS

| | | |
|---|---|---|
| EP | 0 734 121 A1 | 9/1996 |
| EP | 0 897 218 A2 | 2/1999 |
| JP | 10-065489 A | 3/1998 |
| JP | 11-298283 A | 10/1999 |
| JP | 2003-110404 A | 4/2003 |
| JP | 2004-129238 A | 4/2004 |

OTHER PUBLICATIONS

International Search Report; PCT/JP2007/071887; Jan. 22, 2008.

(Continued)

*Primary Examiner* — Dean O Takaoka
*Assistant Examiner* — Alan Wong
(74) *Attorney, Agent, or Firm* — Studebaker & Brackett PC; Tim L. Brackett, Jr.; John F. Guay

(57) ABSTRACT

An acoustic wave filter device includes plural filter circuits between an input terminal and an output terminal. Plural inductors are connected in series in a series arm that connects the input terminal and the output terminal, and plural first acoustic wave resonators are connected between the series arm and a ground potential. Each of the filter circuits includes at least one of the inductors and one of the first acoustic wave resonators. A second acoustic wave resonator in the series arm connects adjacent filter circuits. The acoustic wave filter device has a pass band lower than a trap band, steep attenuation characteristics in a range from the pass band to the trap band, and is capable of providing a large amount of attenuation in the trap band.

20 Claims, 9 Drawing Sheets

OTHER PUBLICATIONS

S. Mineyoshi et al.; "Analysis and optimal SAW ladder filter design including bonding wire and package impedance."; 1997 IEEE Ultrasonics Symposium; Oct. 5, 1997, pp. 175-178, vol. 1, XP010271370.
Extended European Search Report dated Apr. 27, 2010; Application No./ Patent No. 07831617.1-1233 / 2093881 PCT/JP2007071887.

Preliminary Examination Report from Taiwan Intellectual Property Office dated Sep. 6, 2010; Taiwan Patent Application No. 96143036.
N. Shibagaki et al.; "Acoustcally-Induced Migration of Thin Film electrodes in SAW-Resonator-Coupled Filters"; 1991 Ultrasonics Symposium, vol. 1, pp. 439-443, Dec. 1991.

* cited by examiner

ACOUSTIC WAVE FILTER DEVICE

CROSS REFERENCE TO RELATED APPLICATIONS

The present application is a continuation of International Application No. PCT/JP2007/071887, filed Nov. 12, 2007, which claims priority to Japanese Patent Application No. JP 2006-337116, filed Dec. 14, 2006, the entire contents of each of these applications being incorporated herein by reference in their entirety.

BACKGROUND

1. Technical Field

An acoustic wave filter device having a pass band lower than a trap band is disclosed.

2. Description of the Related Art

Up until now, various filter devices using acoustic waves, such as surface acoustic wave devices and boundary acoustic wave devices, have been proposed as band filters for communication apparatuses. For example, surface acoustic wave devices have been widely used as RF band filters for mobile phones.

Recently, digital terrestrial television broadcasting has been becoming widespread. In digital terrestrial broadcasting, one channel is divided into 13 segments. Of the 13 segments, one segment located at the center of one channel is used as a transmission band for mobile phones. Broadcasting using this one segment is so-called one-segment broadcasting, which uses a transmission band from 470 MHz to 770 MHz.

Transmission bands for mobile phones may vary among different methods and communications companies. For example, a band of 800 MHz or more, such as from 830 MHz to 845 MHz or from 898 MHz to 924 MHz, a 1.7 GHz band, and a 1.9 GHz band are used. Some mobile phones are capable of receiving and even recording one-segment broadcasting. In such a mobile phone, if phone transmission is performed simultaneously with reception and recording of one-segment broadcasting, a received video image may be distorted due to the effect of transmitted radio waves. Accordingly, there is a demand for band rejection filters having a trap band equal to a transmission band of the mobile phone and having a pass band lower than the trap band.

Japanese Unexamined Patent Application Publication No. 2004-129238 ("the '238 application") discloses an example of a surface acoustic wave filter device of band rejection type. FIG. 14 illustrates a circuit configuration of the surface acoustic wave filter device described in the '238 application.

As shown in FIG. 14, a surface acoustic wave filter device 501 has an input terminal 502 and an output terminal 503. An inductor 504 is provided in a series arm connecting the input terminal 502 and the output terminal 503. A surface acoustic wave resonator 505 is connected between one end of the inductor 504 and a ground potential, while a surface acoustic wave resonator 506 is connected between the other end of the inductor 504 and the ground potential. That is, the inductor 504 and the two surface acoustic wave resonators 505 and 506 are provided as a π-type filter circuit.

In the surface acoustic wave filter device 501, resonance frequencies of the surface acoustic wave resonators 505 and 506 are placed in an attenuation band in intended filter characteristics, an electric signal at the resonance frequencies is lowered to the ground potential, and thus attenuation characteristics are obtained. That is, a trap band is defined by the resonance frequencies of the surface acoustic wave resonators 505 and 506.

In the surface acoustic wave device 501, the resonance frequencies of the surface acoustic wave resonators 505 and 506 are placed in a frequency range where a trap is provided, and thus the trap band is defined. However, until the electric signal at the resonance frequencies is lowered to the ground potential, the electric signal has a common inductance component on a piezoelectric substrate or a package included in the surface acoustic wave filter device 501. As a result, since the signal leaks through the surface acoustic wave resonators 505 and 506, satisfactory attenuation characteristics cannot be achieved in the trap band. Therefore, for example, if the surface acoustic wave filter device 501 is used as a band rejection filter for a reception stage of one-segment broadcasting in the mobile phone capable of receiving one-segment broadcasting, it is difficult to reliably attenuate transmitted radio waves of the mobile phone during reception or recording of one-segment broadcasting.

SUMMARY

To overcome the problems of the conventional techniques described above, and to provide an acoustic wave filter device having steep attenuation characteristics in a region of a trap band near a pass band and capable of providing a large amount of attenuation, embodiments of the invention provide an acoustic wave filter device having a trap band and a pass band lower than the trap band. The acoustic wave filter device includes a plurality of inductors connected in series in a series arm having and connecting an input terminal and an output terminal, and a plurality of first acoustic wave resonators connected between the series arm and a ground potential.

In the acoustic wave filter device, plural filter circuits are arranged in a direction from the input terminal to the output terminal. Each of the plural filter circuits includes at least one of the plural inductors and the first acoustic wave resonators connected between the ground potential and respective ends of the at least one of the plurality of inductors.

The acoustic wave filter device further includes a second acoustic wave resonator provided in the series arm. In at least one of areas where the plural filter circuits are adjacent to each other, the adjacent filter circuits are electrically connected by the second acoustic wave resonator.

In the acoustic wave filter device according to the invention, in every area where filter circuits are adjacent to each other, the adjacent filter circuits are electrically connected by the second acoustic wave resonator.

DETAILED DESCRIPTION

Hereinafter, with reference to the drawings, the invention will be made apparent by describing exemplary embodiments.

Figure 1:
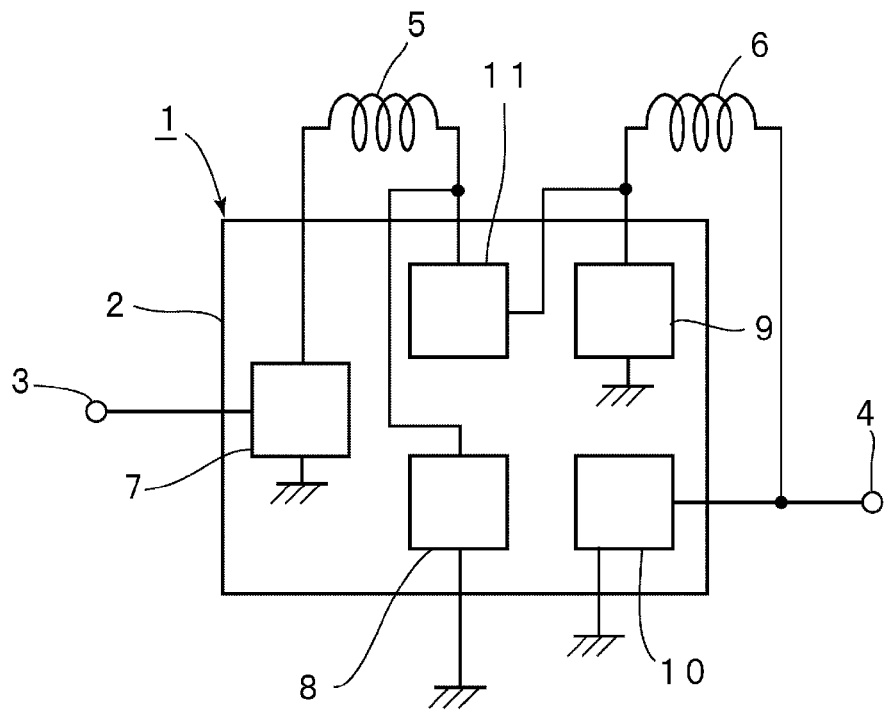
FIG. 1 is a schematic plan view of an acoustic wave filter device according to an exemplary embodiment.
Figure 2:
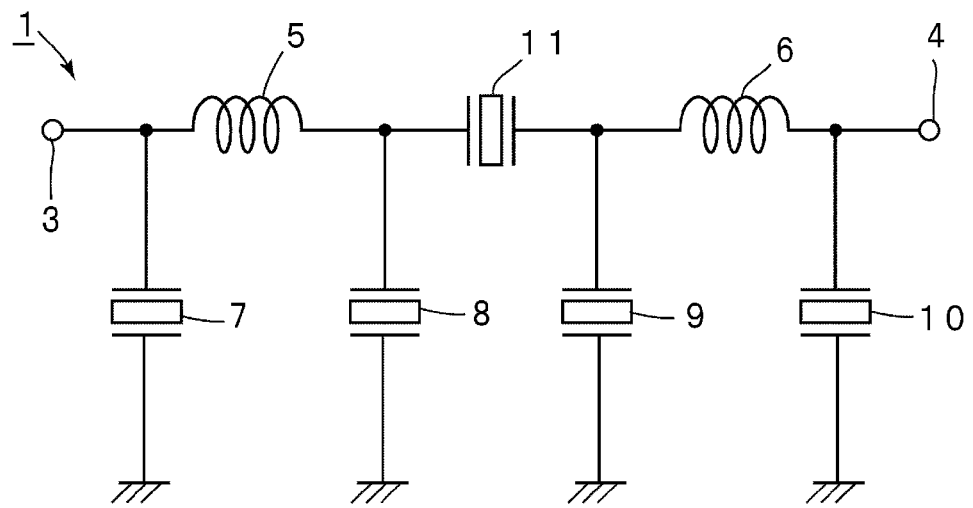
FIG. 2 is a circuit diagram of the acoustic wave filter device according to the embodiment shown in FIG. 1.

FIG. 1 is a schematic plan view of an exemplary acoustic wave filter device 1 according to an embodiment. FIG. 2 is a circuit diagram of the acoustic wave filter device 1 of the FIG. 1 embodiment. The acoustic wave filter device 1 is a surface acoustic wave filter device using surface acoustic waves.

As illustrated in FIG. 1, the acoustic wave filter device 1 can include a piezoelectric substrate 2. For example, a Y-cut X-propagating lithium niobate ($LiNbO_3$) substrate can be used as the piezoelectric substrate 2. Alternatively, the piezoelectric substrate 2 can be a $LiNbO_3$ substrate having a different crystal orientation, a different piezoelectric single crystal substrate, such as a piezoelectric $LiTaO_3$ or quartz substrate, or a piezoelectric ceramic substrate.

A circuit configuration illustrated in FIG. 2 can be realized by providing metal, for example as aluminum (Al) or copper (Cu), or alloy electrodes on the piezoelectric substrate 2. As illustrated in FIG. 2, the acoustic wave filter device 1 has a series arm connecting an input terminal 3 and an output terminal 4. A plurality of inductors 5 and 6 are provided in the series arm. A plurality of first acoustic wave resonators 7 to 11 are connected such that the series arm is connected to a ground potential. That is, the first acoustic wave resonator 7 is connected between the series arm and the ground potential to form one parallel arm. Similarly, each of the other first acoustic wave resonators 8 to 10 forms one parallel arm.

The embodiment shown in FIG. 2 includes an inductor 5, the first acoustic wave resonator 7 connected between one end of the inductor 5 and the ground potential, and the first acoustic wave resonator 8 connected between the other end of the inductor 5 and the ground potential. The first acoustic wave resonator 7, inductor 5, and first acoustic wave resonator 8 are provided as a π-type first filter circuit. Similarly, an inductor 6, the first acoustic wave resonator 9 connected between one end of the inductor 6 and the ground potential, and the first acoustic wave resonator 10 connected between the other end of the inductor 6 and the ground potential are provided as a π-type second filter circuit.

As shown in FIGS. 1 and 2, a second acoustic wave resonator 11 is provided in the series arm to electrically connect the first and second filter circuits. For example, the second acoustic wave resonator 11 can be provided in the series arm in an area where the first and second filter circuits are adjacent to each other, and thus electrically connect the adjacent first and second filter circuits to each other.

In FIG. 1, each of the first acoustic wave resonators 7 to 10 and the second acoustic wave resonator 11 is schematically represented by a rectangular frame. Each of the acoustic wave resonators can be produced, for example, by providing an interdigited (IDT) electrode and a pair of reflectors (not shown) on the piezoelectric substrate 2. The reflectors can be arranged on both sides of the IDT electrode in a surface wave propagation direction, although an electrode structure of each resonator 7 to 11 is not particularly limited to this.

As illustrated in FIG. 1, a compact surface acoustic wave filter chip can be produced by providing the acoustic wave resonators 7 to 11 on one piezoelectric substrate 2. As shown in FIG. 1, the inductors 5 and 6 are provided as inductance components external to the piezoelectric substrate 2. Alternatively, the inductors 5 and 6 may be provided on the piezoelectric substrate 2 or provided by providing an inductance element section within the piezoelectric substrate 2. Also, one or more of the acoustic wave resonators 7 to 11 may be provided as discrete components instead of integrating two or more of them on a common piezoelectric substrate.

Figure 3:
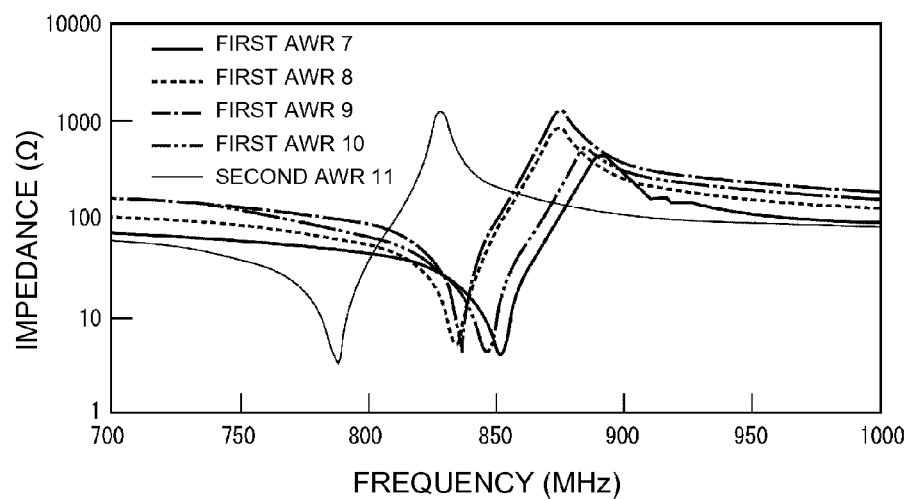
FIG. 3 is a graph showing impedance characteristics of each acoustic wave resonator (AWR) included in the acoustic wave filter device according to the exemplary embodiment shown in FIG. 2.

FIG. 3 shows impedance characteristics of the first acoustic wave resonators 7 to 10 and impedance characteristics of the second acoustic wave resonator 11. In FIG. 3, "acoustic wave resonator" is represented as "AWR" for clarity of illustration. Impedances at resonance frequencies of the first acoustic wave resonators 7 to 10 (i.e., parallel arm resonators) and an impedance at an antiresonance frequency of the second acoustic wave resonator 11 (i.e., series arm resonator) are used to define a trap band, that is, an attenuation band.

As shown in FIGS. 1 and 2, the first and second filter circuits are connected to each other by the second acoustic wave resonator 11. As will be described later in detail, this arrangement can increase the amount of attenuation in a region of the trap band near the pass band, and enhance the steepness of attenuation characteristics.

Figure 14:
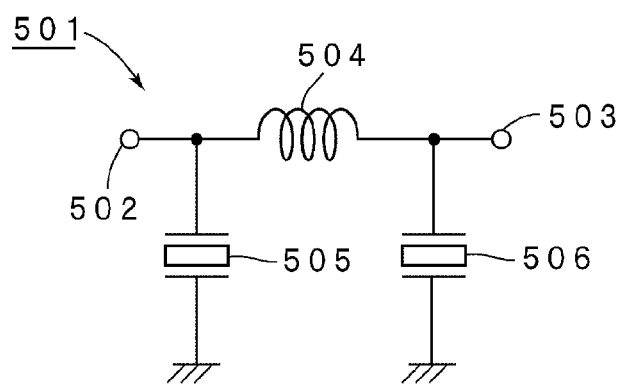
FIG. 14 is a circuit diagram illustrating an example of a conventional surface acoustic wave filter device.
Figure 15:
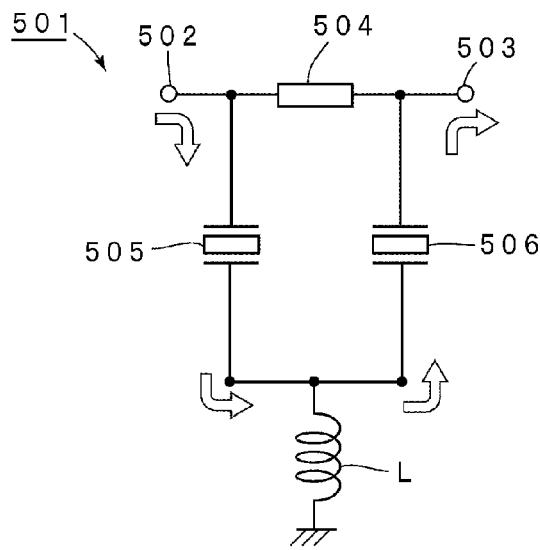
FIG. 15 is a schematic circuit diagram illustrating a signal leakage path in the conventional surface acoustic wave filter device.

With reference now to FIGS. 14 and 15, the conventional surface acoustic wave filter device 501 cannot achieve satisfactory attenuation characteristics. This is probably due to the following: In the surface acoustic wave filter device 501 illustrated in FIG. 14, the surface acoustic wave resonators 505 and 506 are connected by the inductor 504, in other words, by a reactance component. In this case, the resonance frequencies of the surface acoustic wave resonators 505 and 506 are used to obtain attenuation characteristics. However, until the resonance frequencies of the surface acoustic wave resonators 505 and 506, which are a plurality of parallel arm resonators, become close to each other and a signal at the resonance frequencies is lowered to the ground potential, the signal has a common inductance component between the surface acoustic wave resonator 505 or 506 and the ground potential. As indicated by arrows in FIG. 15, this common inductance component causes the signal at the resonance frequency of the surface acoustic wave resonator 505 to pass through a common inductance and the surface acoustic wave resonator 506, and to leak to the output terminal 503. This leads to degradation in attenuation characteristics. An inductance L in FIG. 15 represents an inductance provided by wiring or the like between an electrode land connected to the ground potential of the acoustic wave filter device 1 and the ground potential.

In contrast, the acoustic wave filter device embodiments described herein have filter circuits that are connected to each other by the acoustic wave resonator. For example, the acoustic wave filter 1 having the circuit configuration illustrated in FIG. 2 has the first and second filter circuits connected to each other by the second acoustic wave resonator 11, which can be a series arm resonator. In this case, as described above, the attenuation band can be obtained by using the resonance frequencies of the first acoustic wave resonators 7 to 10, which are parallel arm resonators, and the antiresonance frequency of a series arm second acoustic wave resonator 11.

As shown in FIG. 3, the antiresonance frequency of the second acoustic wave resonator 11 is close to the resonance frequencies of the first acoustic wave resonators 7 to 10. Therefore, although an electric signal at the resonance frequency of the first acoustic wave resonator 7 flows as indicated by arrows in FIG. 4, this signal path is cut off by the second acoustic wave resonator 11. This can reduce signal leakage through the first acoustic wave resonators 7 and 8 to the output terminal. Thus, steep attenuation characteristics with a large amount of attenuation can be obtained.

Figure 4:
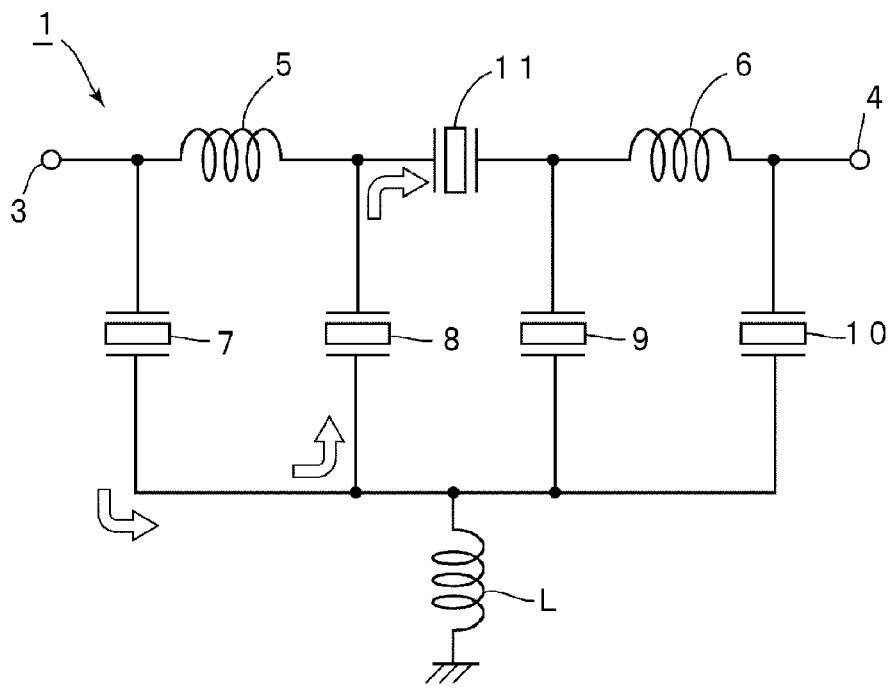
FIG. 4 is a schematic circuit diagram illustrating a mechanism for reducing signal leakage in the acoustic wave filter device according to an exemplary embodiment.

An inductance L in FIG. 4 represents an inductance inserted by wiring or the like between an electrode land connected to the ground potential of the acoustic wave filter device 1 and the ground potential.

Figure 6:
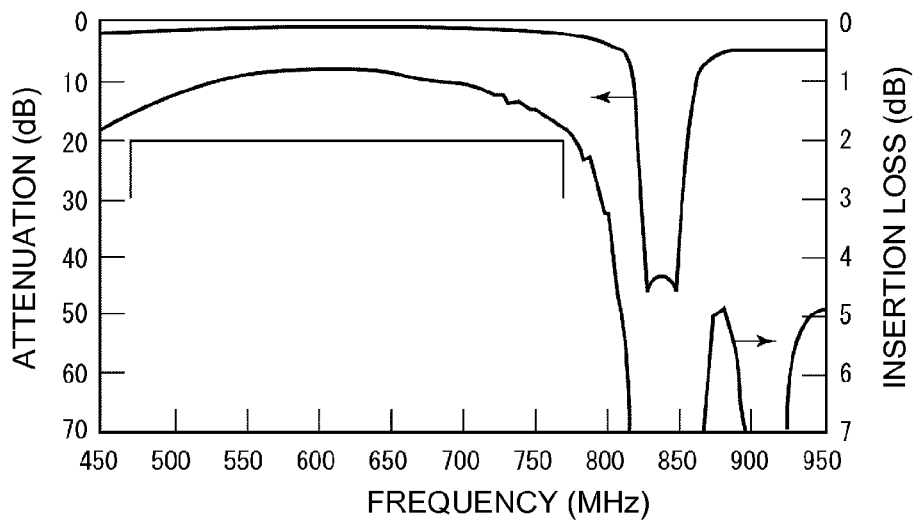
FIG. 6 is a graph showing attenuation frequency characteristics of an acoustic wave filter device according to an exemplary embodiment.
Figure 7:
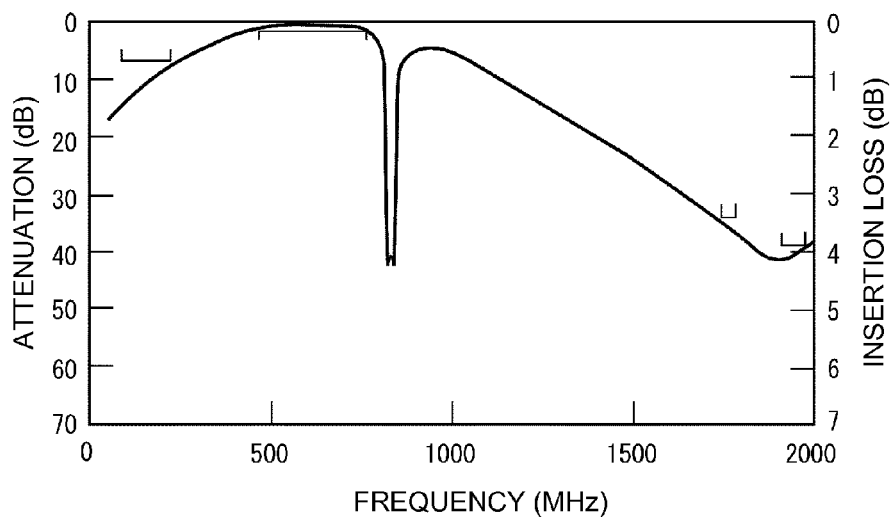
FIG. 7 is a graph showing attenuation frequency characteristics of an acoustic wave filter device according to an exemplary embodiment.

FIG. 6 and FIG. 7 are graphs showing attenuation frequency characteristics of the acoustic wave filter device 1 according to the exemplary embodiment of FIG. 2. As is apparent from FIG. 6 and FIG. 7, a large amount of attenuation can be obtained at frequencies from 820 MHz to 860 MHz. As shown, steepness of attenuation frequency characteristics can be achieved in the range from the pass band lower than the trap band to the trap band.

When the acoustic wave filter device 1 is used in a mobile phone, for example, as a band filter for a reception stage of one-segment broadcasting, a transmission band in an RF stage is often defined as an attenuation band. Examples of the transmission band in the RF stage include an 800 MHz band, a 1.7 GHz band, and a 1.9 GHz band. As is apparent from the attenuation frequency characteristics shown in FIG. 6 and FIG. 7, a large amount of attenuation can be obtained in any of these frequency bands.

Embodiments of acoustic wave filter device may include only first and second filter circuits as the plurality of filter circuits. In this case, since the first and second filter circuits are electrically connected to each other by one second acoustic wave resonator 11, it is possible to provide a compact acoustic wave filter device having a simple circuit configuration.

In other embodiments, an acoustic wave filter device may include may include three or more filter circuits filter circuits. For example, FIG. 13 shows an embodiment in which the acoustic wave filter device 1 includes three filter circuits provided between the input terminal 3 and the output terminal 4.

Figure 13:
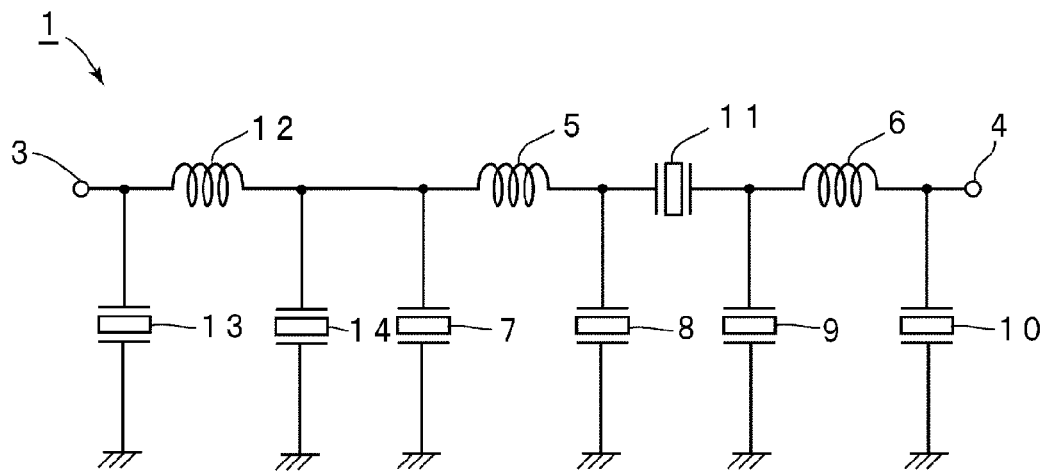
FIG. 13 is a circuit diagram illustrating an acoustic wave filter device according to an exemplary embodiment.

In the embodiment illustrated in FIG. 13, a third filter circuit is further arranged on the input side of the first and second filter circuits. The third filter circuit is a π-type filter circuit composed of an inductance 12 and first acoustic wave resonators 13 and 14, which are parallel arm resonators. As shown in FIG. 13, the third filter circuit is connected to the first filter circuit, with no second acoustic wave resonator therebetween.

Figure 16:
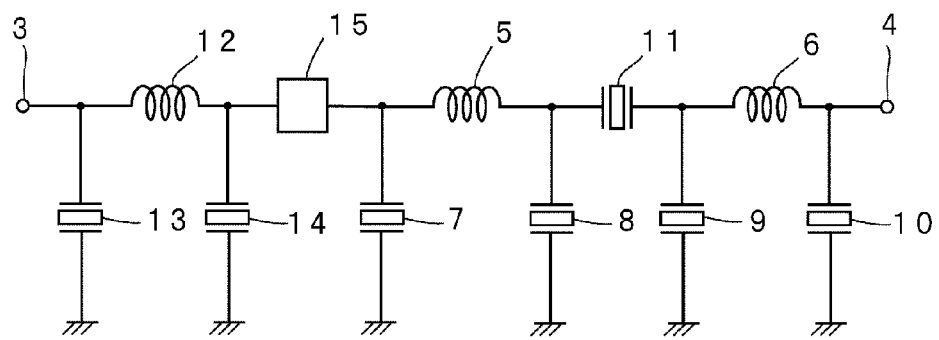
FIG. 16 is a circuit diagram of an acoustic wave filter device according to an exemplary embodiment.

FIG. 16 is a circuit diagram illustrating an embodiment another exemplary acoustic wave filter device. In the embodiment shown in FIG. 16, as in the case of the embodiment of FIG. 13, a third filter circuit is arranged on the input side of first and second filter circuits of the type shown in the FIG. 2 embodiment. Again, the third filter circuit is a π-type filter circuit composed of the inductance 12 and the first acoustic wave resonators 13 and 14, which are parallel arm resonators. In the embodiment of FIG. 16, however, the third filter circuit is connected to the input side of the first filter circuit via a reactance element 15, not an acoustic wave resonator. For example, the reactance element 15 may be an inductor or a capacitor.

As is apparent from the modifications illustrated in FIG. 13 and FIG. 16, it is only necessary that adjacent filter circuits be connected by the second acoustic wave resonator 11 in at least one area where filter circuits are adjacent to each other. Since the second acoustic wave resonator 11 can block the signal having passed through the first acoustic wave resonators from leaking, it is possible to achieve steep attenuation characteristics and to provide a large amount of attenuation in the attenuation band.

Figure 17:
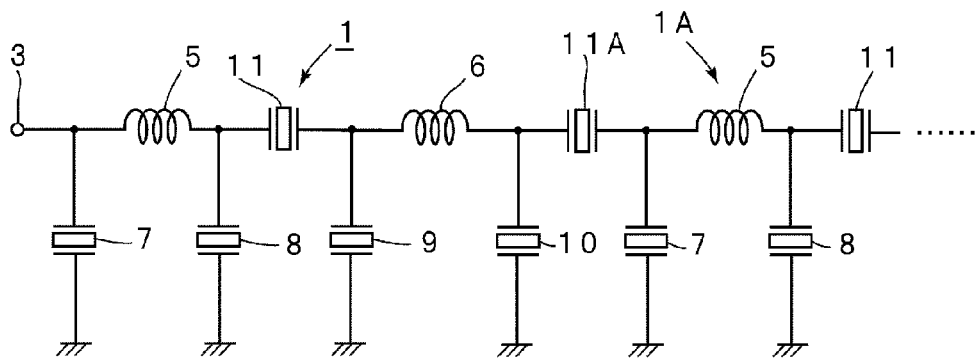
FIG. 17 is a circuit diagram of a multi-stage acoustic wave filter device according to exemplary embodiment.

For embodiments including a plurality of filter circuits, a second acoustic wave resonator can be provided in every area where two filter circuits are adjacent to each other. FIG. 17 is a circuit diagram of such an embodiment.

FIG. 17 shows a multi-stage acoustic wave filter device provided by connecting a plurality of acoustic wave filter devices 1 of the FIG. 2 embodiment in the direction from the input terminal 3 toward an output terminal (not shown). FIG. 17 illustrates the acoustic wave filter device 1 in the first stage and part of an acoustic wave filter device 1A in the next stage. The acoustic wave filter device 1 and the acoustic wave filter device 1A are connected to each other via a second acoustic wave resonator 11A. That is, the first and second filter circuits of the acoustic wave filter device 1 are connected to each other by the second acoustic wave resonator 11, and the second filter circuit of the acoustic wave filter device 1 and the first filter circuit of the acoustic wave filter device 1A in the next stage are electrically connected to each other by the second acoustic wave resonator 11A. As described above, in the acoustic wave filter device of the present embodiment, a second acoustic wave resonator is provided in every area where two filter circuits are adjacent to each other. This makes it possible to more reliably achieve steep attenuation characteristics and provide a larger amount of attenuation in the attenuation band.

In the above embodiments, two filter circuits are connected to one second acoustic wave resonator, resulting in a configuration that makes it possible to produce the acoustic wave filter device 1 without significantly increasing the number of components. Thus, it is possible to reduce the number of components, mounting space, and costs.

As described above, a leakage signal path is blocked by the second acoustic wave resonator 11. As indicated by arrows in FIG. 5 with respect to the FIG. 2 embodiment, it is possible that a signal having passed through the first acoustic wave resonator 7 and the first acoustic wave resonator 10 on the output terminal side leaks out. However, since the flow of a signal having passed through the first acoustic wave resonator 7 and the first acoustic wave resonator 8 is blocked as described above, it is possible to achieve steep resonance characteristics and realize a large amount of attenuation in the rejection band.

Figure 5:
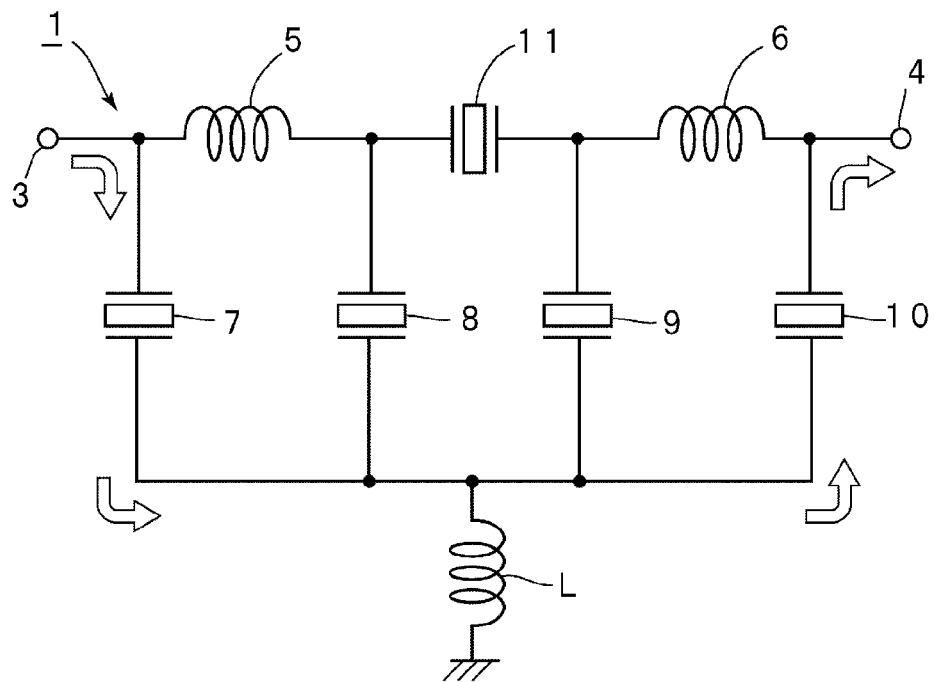
FIG. 5 is a circuit diagram illustrating a path along which a signal leaks to an output terminal in an acoustic wave filter device according to an exemplary embodiment.
Figure 8:
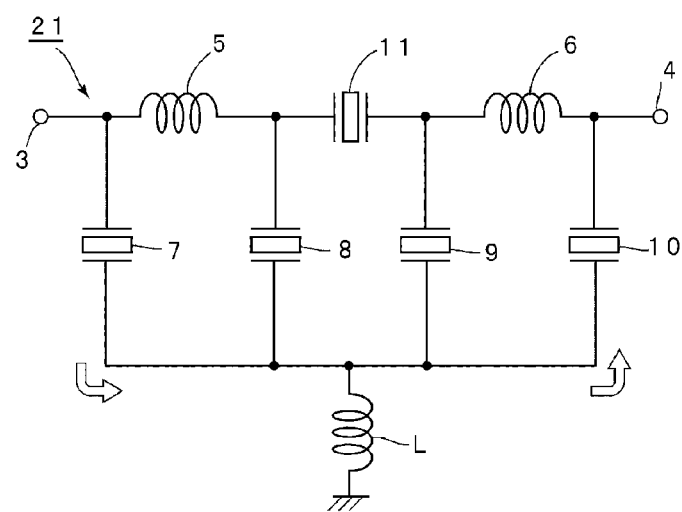
FIG. 8 is a circuit diagram of an acoustic wave filter device according to an exemplary embodiment.

As illustrated in FIG. 5, in the acoustic wave filter device 1 of the first embodiment, a signal having passed through the first acoustic wave resonator 7 and the first acoustic wave resonator 10 on the output terminal side may leak out. FIG. 8 is a circuit diagram of an exemplary acoustic wave filter device 21 that is capable of preventing such signal leakage.

As shown in FIG. 8, the acoustic wave filter device 21 is similar to the acoustic wave filter device 1 of the embodiment shown in FIG. 2 in that it includes the first acoustic wave resonators 7 to 10, the second acoustic wave resonator 11, and the inductances 5 and 6.

The acoustic wave filter device 21 is different from the acoustic wave filter device 1 in that, of the four first acoustic wave resonators 7 to 10, the first acoustic wave resonator 10 connected to the output terminal 3 has a resonance frequency that is different from those of the other first acoustic wave resonators 7 to 9 and is positioned away from the trap band of the acoustic wave filter device 21. Thus, in the trap band, the first acoustic wave resonator 10 functions simply as a capacitive element.

Figure 9:
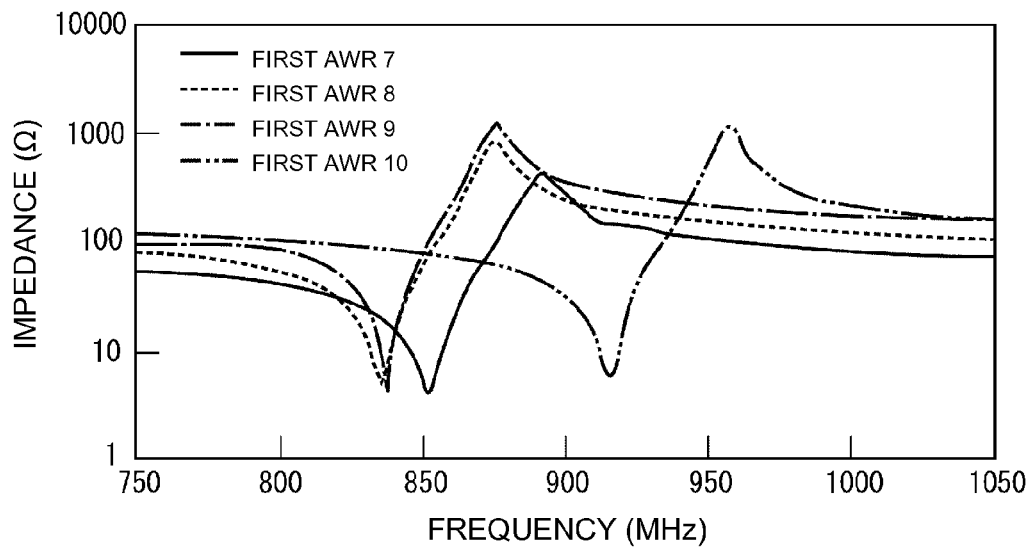
FIG. 9 is a graph showing impedance characteristics of plural first acoustic wave resonators (AWRs) included in the acoustic wave filter device of the exemplary embodiment shown in FIG. 8.

FIG. 9 is a graph showing impedance characteristics of the four first acoustic wave resonators of the embodiment shown in FIG. 2. The legend in FIG. 9 represents "acoustic wave resonator" using "AWR" for clarity of illustration. As shown in FIG. 9, the impedance of the first acoustic wave resonator 10 increases at frequencies near the attenuation band. Therefore, it is difficult for an electric signal at the resonance frequencies of the first acoustic wave resonators 7 to 9 to pass through the first acoustic wave resonator 10. Thus, it is possible to effectively suppress signal leakage along the signal path illustrated in FIG. 5. When compared with the embodiment shown in FIG. 2, the embodiment of FIG. 8 can provide a larger amount of attenuation and achieve steeper attenuation characteristics.

Figure 10:
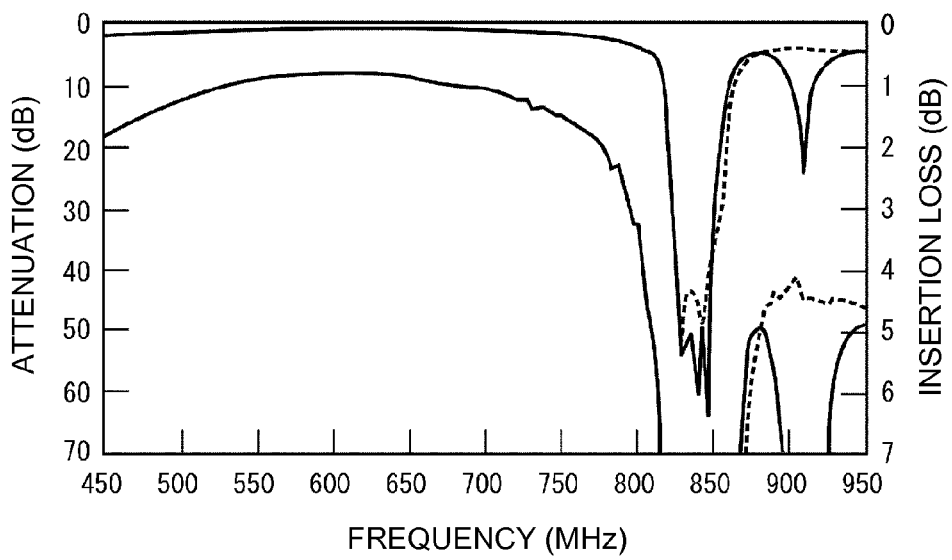
FIG. 10 is a graph showing attenuation frequency characteristics of acoustic wave filter devices according to the exemplary embodiment shown in FIG. 2 and the exemplary embodiment shown in FIG. 8.

FIG. 10 is a graph showing the attenuation frequency characteristics of the acoustic wave filter device 1 according to the embodiment of FIG. 2 as a solid line, and the attenuation frequency characteristics of the acoustic wave filter device 21 according embodiment of FIG. 8 as a broken line. As is apparent from FIG. 10, the FIG. 8 embodiment makes it possible to provide a larger amount of attenuation and achieve steeper attenuation characteristics than those in the case of the FIG. 2 embodiment.

As described above, an embodiment can selectively use a plurality of first acoustic wave resonators, that is, a plurality of parallel arm resonators, as a resonator or a capacitive element in the trap band.

According to embodiments, it is possible to provide band filters, such as band rejection filters, capable of satisfying new market demands for having a plurality of trap bands near the pass band. For example, as a transmission band in an RF stage of a mobile phone, a plurality of trap frequency bands near the pass band of the acoustic wave filter device 21 shown in FIG. 8 embodiment may be used.

In this example, the lowest of plural trap frequency bands is set as a trap band of the acoustic wave filter device 21. Then, the other trap bands are defined by positioning, in the remaining trap frequency bands, the resonance frequency of the first acoustic wave resonator used as a capacitive element in the trap band. Thus, plural trap bands can be defined by varying the resonance frequencies of the plurality of parallel arm resonators, that is, the plurality of first acoustic wave resonators. It is thus possible to produce a band rejection filter having a plurality of trap bands higher than the pass band.

Figure 11:
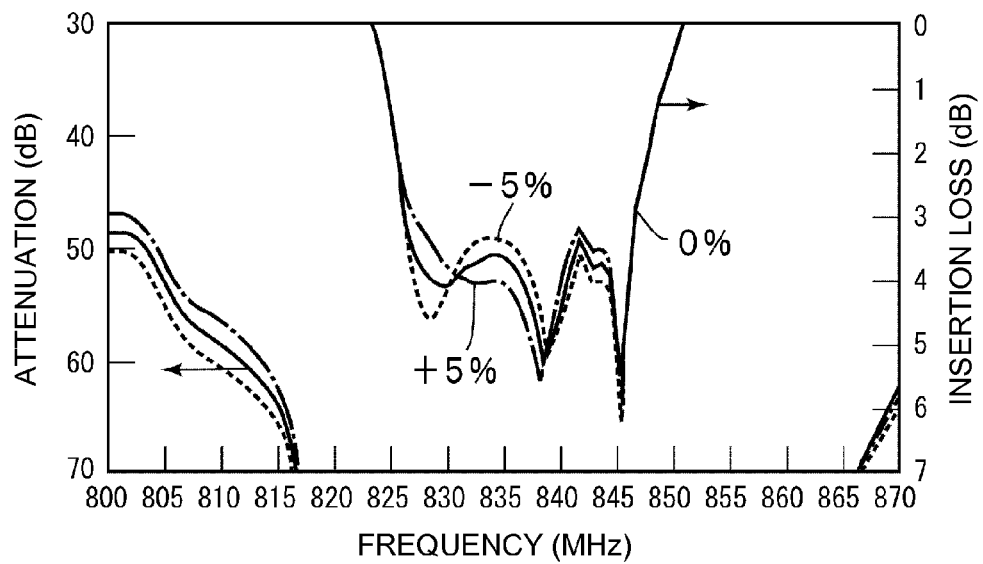
FIG. 11 is a graph showing attenuation characteristics corresponding to different inductances of inductors in the acoustic wave filter device of the exemplary embodiment shown in FIG. 8.

In the embodiment of FIG. 8, attenuation characteristics are less likely to be changed by variations in an inductance value of the inductors 5 and 6. This will be explained with reference to the graph of FIG. 11 showing attenuation characteristics observed when the inductance value of the inductors 5 and 6 varies ±5% in the acoustic wave filter device 21. In FIG. 11, a solid line represents filter characteristics corresponding to a standard inductance value, a broken line represents filter characteristics observed when the inductance value of the inductors 5 and 6 is 5% higher than the standard inductance value, and an alternate long and short dashed line represents filter characteristics observed when the inductance value of the inductors 5 and 6 is 5% lower than the standard inductance value. As is apparent from FIG. 11, there is almost no effect on filter characteristics even when the inductance value of the inductors 5 and 6, for example, external inductance components, varies ±5%.

Hence, embodiments of an acoustic wave filter device can include at least one of a plurality of first acoustic wave resonators having a resonance frequency of is outside the trap band. In such a case, since the first acoustic wave resonator whose resonance frequency is set to a value outside the trap band has a resonance frequency outside the trap band, an attenuation band other than the trap band can be provided at the resonance frequency of the at least one acoustic wave resonator. That is, it is possible to provide a filter device having a plurality of attenuation bands.

Additionally, the first acoustic wave resonator having the resonance frequency outside the trap band can be connected between the output terminal and the ground potential. In this case, the first acoustic wave resonator having the resonance frequency outside the trap band becomes capacitive in the trap band, and an impedance of the first acoustic wave resonator increases. Thus, a leakage signal in the trap band is less likely to reach the output terminal via the first acoustic wave resonator having the resonance frequency outside the trap band. Therefore, it is possible to further increase the amount of attenuation in the attenuation band and further enhance the steepness of attenuation frequency characteristics.

Figure 12:
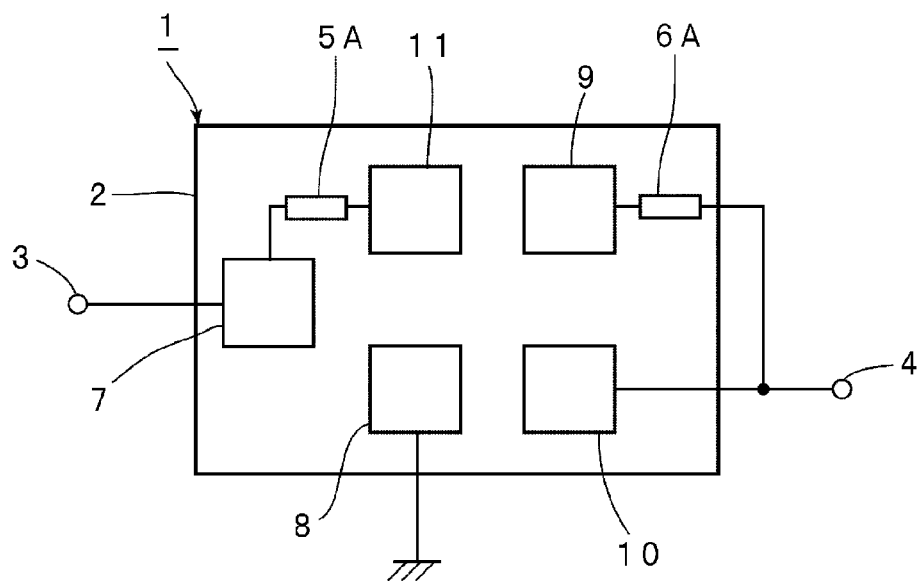
FIG. 12 is a schematic plan view illustrating an exemplary embodiment of an acoustic wave filter device in which chip coils constituting inductors are mounted on a piezoelectric substrate.

As schematically illustrated in FIG. 12, the inductors 5 and 6 can be chip coil components 5A and 6A mounted on the piezoelectric substrate 2. In such a case, the acoustic wave filter device 1 can be readily produced, for example, by surface-mounting the chip coil components on the piezoelectric substrate. Providing inductance elements on or within the piezoelectric substrate 2 makes it possible to omit the process of mounting external components, such as the above-described chip coils, and can reduce variations in characteristics caused by variations in mounting.

Next, another embodiment of the invention will be described. An acoustic wave filter device of this embodiment is similar to the acoustic wave filter device 1 of the first embodiment in that it includes the first acoustic wave resonators 7 to 10, the second acoustic wave resonator 11, and the inductances 5 and 6. A circuit diagram of the acoustic wave filter device according to the third embodiment is identical to the circuit diagram of the acoustic wave filter device 1 according to the embodiment illustrated in FIG. 2.

The acoustic wave filter device of the present embodiment is different from the acoustic wave filter device 1 in terms of the relationship between the antiresonance frequency of the second acoustic wave resonator 11 (i.e., series arm resonator)

and the resonance frequencies of the first acoustic wave resonators, the antiresonance and resonance frequencies defining the trap band. That is, the antiresonance frequency of the second acoustic wave resonator 11 according to the embodiments corresponding to FIG. 2 is set to a value between the maximum and minimum values among the resonance frequencies of the first acoustic wave resonators, the resonance frequencies defining the trap band, whereas the antiresonance frequency of the second acoustic wave resonator 11 according to the present embodiment is set to a value lower than the minimum value among the resonance frequencies of the first acoustic wave resonators. Table 1 shows the resonance and antiresonance frequencies of the first and second acoustic wave resonators of the acoustic wave filter device according to the present embodiment.

For comparison, Table 2 shows resonance frequency and antiresonance frequency values of an exemplary acoustic wave filter device that was produced according to have a configuration similar to that of the acoustic wave filter device of embodiment of FIG. 2.

TABLE 1

| | Resonance Frequency (MHz) | Antiresonance Frequency (MHz) |
|---|---|---|
| First Acoustic Wave Resonator 7 | 826 | 854 |
| First Acoustic Wave Resonator 8 | 842 | 870 |
| First Acoustic Wave Resonator 9 | 834 | 859 |
| First Acoustic Wave Resonator 10 | 844 | 872 |
| Second Acoustic Wave Resonator 11 | 796 | 821 |

TABLE 2

| | Resonance Frequency (MHz) | Antiresonance Frequency (MHz) |
|---|---|---|
| First Acoustic Wave Resonator 7 | 819 | 846 |
| First Acoustic Wave Resonator 8 | 832 | 859 |
| First Acoustic Wave Resonator 9 | 822 | 846 |
| First Acoustic Wave Resonator 10 | 844 | 872 |
| Second Acoustic Wave Resonator 11 | 805 | 832 |

Figure 18:
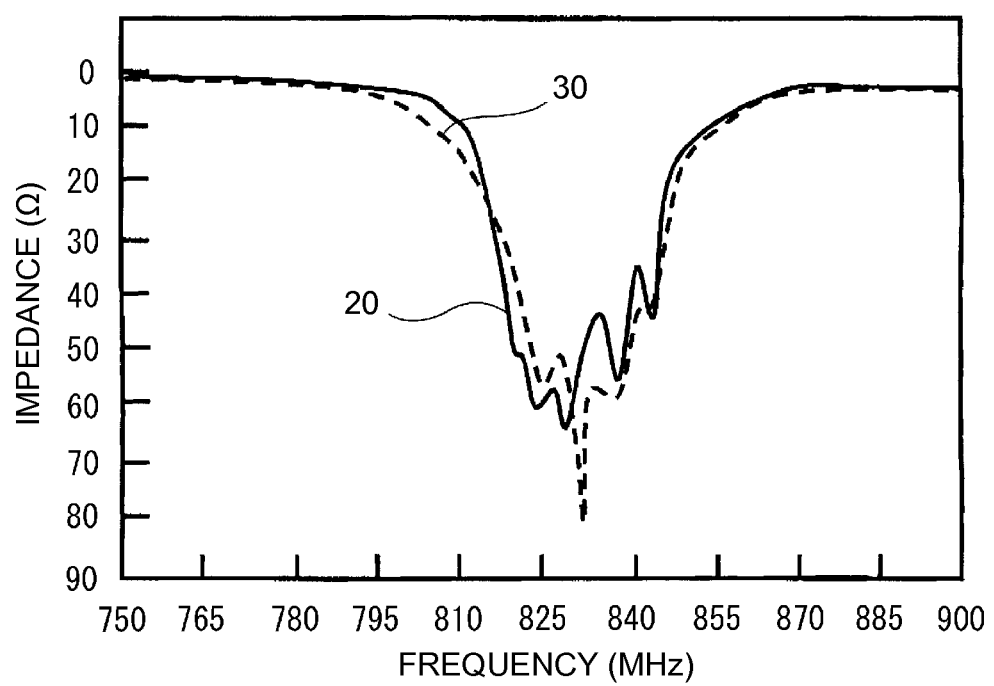
FIG. 18 is a graph showing attenuation frequency characteristics of two exemplary acoustic wave filter device embodiments.

FIG. 18 shows a graph 20 of attenuation frequency characteristics of the acoustic wave filter device according the present embodiment in which the antiresonance frequency of the second acoustic wave resonator is set to a value lower than the minimum value among the resonance frequencies of the first acoustic wave resonators. Also shown in FIG. 18 a graph 30 of attenuation frequency characteristics of the acoustic wave filter device according the embodiment similar to the embodiment of FIG. 2 in which the antiresonance frequency of the second acoustic wave resonator is set to a value between the maximum and minimum values among the resonance frequencies of the first acoustic wave resonators.

As can be seen in FIG. 18, embodiments corresponding to graph 20 exhibit improved steepness of the attenuation frequency characteristics in the range from the pass band to the trap band when compared with embodiments that correspond to graph 30.

In some embodiments, the antiresonance frequency of the second acoustic wave resonator is set lower than the minimum value among the resonance frequencies of the first acoustic wave resonators, the resonance frequencies defining the trap band, and higher than 0.95 times the minimum value. This is because if the antiresonance frequency of the second acoustic wave resonator is too far from the trap band, the amount of attenuation in the trap band becomes small.

Embodiments in which an antiresonance frequency of the second acoustic wave resonator is set to be lower than resonance frequencies of the first acoustic wave resonators, and where the resonance frequencies define the trap band, result in improved the steepness of attenuation frequency characteristics in the range from the pass band to the trap band.

Additionally, plural filter circuits can be arranged in a direction from the input terminal to the output terminal. Each of the plurality of filter circuits can comprise at least one of the plurality of inductors and the first acoustic wave resonators connected between the ground potential and respective ends of the at least one of the plurality of inductors. Then, in at least one of areas where the plurality of filter circuits are adjacent to each other, the adjacent filter circuits are electrically connected by the second acoustic wave resonator. Thus, a fractional pass bandwidth as high as 50% or more can be realized, and it is possible to achieve steeper attenuation characteristics near the pass band and provide a larger amount of attenuation. For example, on a mobile phone, even when transmission takes place during reception or recording of one-segment broadcasting, it is possible to reliably suppress distortion of a received video image caused by the transmitted radio waves. That is, it is possible to provide an acoustic wave filter device suitable for use as a band rejection filter having a trap band near a pass band and required to provide a large amount of attenuation in the trap band.

Although a limited number of embodiments are described herein, one of ordinary skill in the art will readily recognize that there could be variations to any of these embodiments and those variations would be within the scope of the appended claims. For example, the invention is also applicable to boundary acoustic wave filter devices using boundary acoustic waves instead of surface acoustic waves. Thus, it will be apparent to those skilled in the art that various changes and modifications can be made to the acoustic wave filter device described herein without departing from the scope of the appended claims and their equivalents.

What is claimed is:

1. An acoustic wave filter device having a trap band and a pass band lower than the trap band, the acoustic wave filter device comprising:
a plurality of inductors connected in series in a series arm having and connecting an input terminal and an output terminal; and
a plurality of first acoustic wave resonators connected between the series arm and a ground potential, the plurality of inductors and the plurality of first acoustic wave resonators being arranged as a plurality of π-type filter circuits
in a direction from the input terminal to the output terminal, each of the plurality of π-type filter circuits being composed of at least one of the plurality of inductors and the first acoustic wave resonators connected between the ground potential and respective ends of the at least one of the plurality of inductors,
the acoustic wave filter device further comprising a second acoustic wave resonator having an anti-resonance frequency provided in the series arm, wherein in at least one of portions where the plurality of filter circuits are adjacent to each other, the adjacent π-type filter circuits are electrically connected by the second acoustic wave resonator, and wherein the anti-resonance frequency of the second acoustic wave resonator is located in the trap band defined by a resonance frequency of at least one of the plurality of first acoustic wave resonators.

2. The acoustic wave filter device according to claim 1, wherein in every portion where π-type_filter circuits are adjacent to each other, the adjacent π-type filter circuits are electrically connected by the second acoustic wave resonator.

3. The acoustic wave filter device according to claim 1, wherein the plurality of π-type filter circuits are first and second filter circuits, and the first and second filter circuits are electrically connected to each other by the second acoustic wave resonator.

4. The acoustic wave filter device according to claim 2, wherein the plurality of π-type filter circuits are first and second filter circuits, and the first and second filter circuits are electrically connected to each other by the second acoustic wave resonator.

5. The acoustic wave filter device according to claim 1, wherein a resonance frequency of at least one of the plurality of first acoustic wave resonators is outside the trap band.

6. The acoustic wave filter device according to claim 2, wherein a resonance frequency of at least one of the plurality of first acoustic wave resonators is outside the trap band.

7. The acoustic wave filter device according to claim 3, wherein a resonance frequency of at least one of the plurality of first acoustic wave resonators is outside the trap band.

8. The acoustic wave filter device according to claim 4, wherein a resonance frequency of at least one of the plurality of first acoustic wave resonators is outside the trap band.

9. The acoustic wave filter device according to claim 5, wherein the at least one of the plurality of first acoustic wave resonators having the resonance frequency outside the trap band is connected between the output terminal and the ground potential.

10. The acoustic wave filter device according to claim 6, wherein the at least one of the plurality of first acoustic wave resonators having the resonance frequency outside the trap band is connected between the output terminal and the ground potential.

11. The acoustic wave filter device according to claim 7, wherein the at least one of the plurality of first acoustic wave resonators having the resonance frequency outside the trap band is connected between the output terminal and the ground potential.

12. The acoustic wave filter device according to claim 8, wherein the at least one of the plurality of first acoustic wave resonators having the resonance frequency outside the trap band is connected between the output terminal and the ground potential.

13. The acoustic wave filter device according to claim 1, further comprising a piezoelectric substrate, wherein the plurality of the first acoustic wave resonators and the second acoustic wave resonator are provided on the piezoelectric substrate.

14. The acoustic wave filter device according to claim 1, wherein an antiresonance frequency of the second acoustic wave resonator is set to be lower than resonance frequencies of the plurality of the first acoustic wave resonators, the resonance frequencies defining the trap band.

15. The acoustic wave filter device according to claim 2, wherein an antiresonance frequency of the second acoustic wave resonator is set to be lower than resonance frequencies of the plurality of the first acoustic wave resonators, the resonance frequencies defining the trap band.

16. The acoustic wave filter device according to claim 3, wherein an antiresonance frequency of the second acoustic wave resonator is set to be lower than resonance frequencies of the plurality of the first acoustic wave resonators, the resonance frequencies defining the trap band.

17. The acoustic wave filter device according to claim 4, wherein an antiresonance frequency of the second acoustic wave resonator is set to be lower than resonance frequencies of the plurality of the first acoustic wave resonators, the resonance frequencies defining the trap band.

18. The acoustic wave filter device according to claim 5, wherein an antiresonance frequency of the second acoustic wave resonator is set to be lower than resonance frequencies of the plurality of the first acoustic wave resonators, the resonance frequencies defining the trap band.

19. The acoustic wave filter device according to claim 9, wherein an antiresonance frequency of the second acoustic wave resonator is set to be lower than resonance frequencies of the plurality of the first acoustic wave resonators, the resonance frequencies defining the trap band.

20. The acoustic wave filter device according to claim 13, wherein an antiresonance frequency of the second acoustic wave resonator is set to be lower than resonance frequencies of the plurality of the first acoustic wave resonators, the resonance frequencies defining the trap band.

* * * * *